(12) United States Patent
Hikmet et al.

(10) Patent No.: US 8,672,523 B2
(45) Date of Patent: Mar. 18, 2014

(54) LIGHT EMITTER WITH PREDEFINED ANGULAR COLOR POINT DISTRIBUTION

(75) Inventors: Rifat Ata Mustafa Hikmet, Eindhoven (NL); Ties Van Bommel, Horst (NL); Yongfeng Ni, Waalre (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/395,448

(22) PCT Filed: Apr. 20, 2010

(86) PCT No.: PCT/IB2010/051730
§ 371 (c)(1),
(2), (4) Date: Mar. 12, 2012

(87) PCT Pub. No.: WO2011/033394
PCT Pub. Date: Mar. 24, 2011

(65) Prior Publication Data
US 2012/0170602 A1 Jul. 5, 2012

(30) Foreign Application Priority Data
Sep. 16, 2009 (EP) ..................... 09170471

(51) Int. Cl.
*F21V 1/00* (2006.01)
(52) U.S. Cl.
USPC ........... 362/509; 362/293; 362/487; 313/110; 313/501
(58) Field of Classification Search
USPC .................. 362/311.01–311.05; 313/110–117
See application file for complete search history.

(56) References Cited

U.S. PATENT DOCUMENTS

| | | | |
|---|---|---|---|
| 6,653,765 B1 * | 11/2003 | Levinson et al. | 313/112 |
| 6,890,234 B2 | 5/2005 | Bortscheller et al. | |
| 7,070,300 B2 * | 7/2006 | Harbers et al. | 362/231 |

(Continued)

FOREIGN PATENT DOCUMENTS

| | | |
|---|---|---|
| DE | 102006045702 A1 | 4/2008 |
| WO | 2004068597 A2 | 8/2004 |

(Continued)

*Primary Examiner* — Donald Raleigh
(74) *Attorney, Agent, or Firm* — David Zivan; Mark Beloborodov (57) ABSTRACT

The invention relates to a light emitter adapted for emitting light with a predefined angular color point distribution, to a method of use for a light emitter in video flash applications, in automotive headlight applications and/or in automotive lamp applications, and to a method, adapted for generating light with a predefined angular color point distribution. The light emitter is adapted for emitting light with a predefined angular color point distribution through an output and comprises a phosphor (2) and a pump source (1), wherein the pump source (1) is adapted for emitting pump light to at least part of the phosphor (2), and the phosphor (2) is adapted for emitting phosphor light by light conversion of absorbed pump light, and wherein a matching element (4) is provided which is arranged at least partly between the phosphor (2) and the output of the light emitter, and which is adapted for adjusting the ratio of the light intensity of the emitted phosphor light emitted by the phosphor (2) towards the output of the light emitter to the light intensity of the transmitted pump light going through the phosphor (2) towards the output of the light emitter. In this way, a versatile light emitter with a predefined angular color point distribution in conjunction with any desired angular light intensity distribution is provided at low costs.

12 Claims, 5 Drawing Sheets

(56) References Cited

U.S. PATENT DOCUMENTS

| | | |
|---|---|---|
| 7,482,567 B2 * | 1/2009 | Hoelen et al. ............... 250/205 |
| 7,488,088 B2 | 2/2009 | Brukilacchio |
| 8,147,081 B2 * | 4/2012 | Mrakovich et al. ............. 362/84 |
| 2009/0026908 A1 * | 1/2009 | Bechtel et al. ............... 313/110 |
| 2009/0039272 A1 | 2/2009 | Krummacher et al. |
| 2009/0168395 A1 * | 7/2009 | Mrakovich et al. ............. 362/84 |
| 2009/0267540 A1 * | 10/2009 | Chemel et al. ............... 315/297 |

FOREIGN PATENT DOCUMENTS

| | | |
|---|---|---|
| WO | 2007069123 A2 | 6/2007 |
| WO | 2007085977 A1 | 8/2007 |
| WO | 2008040298 A1 | 4/2008 |

* cited by examiner

LIGHT EMITTER WITH PREDEFINED ANGULAR COLOR POINT DISTRIBUTION

FIELD OF THE INVENTION

The invention relates to a light emitter adapted for emitting light with a predefined angular color point distribution through an output, to a method of use for a light emitter in video flash applications, in automotive headlight applications and/or in automotive lamp applications, and to a method for generating light with a predefined angular color point distribution.

BACKGROUND OF THE INVENTION

Document U.S. Pat. No. 7,488,088 B2 describes a light emitting diode lighting device, an LED lighting device for short, and a method that produces high intensity and spatially uniform white light in the near and far fields in a reduced package size that does not significantly heat the surrounding environment, wherein the white light is produced by using a phosphor layer in conjunction with at least one LED.

Figure 1:
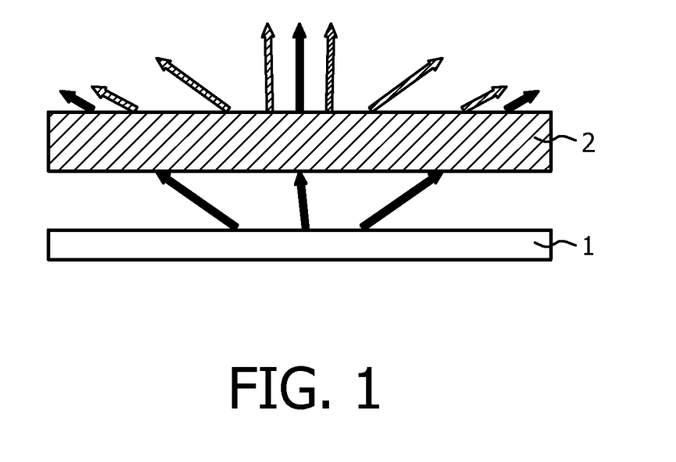
FIG. 1 shows the effect of blue LED pump light falling onto a phosphor at larger angles.

In different phosphor converted LED applications, such as in camera flash, and in general illumination applications, constant color point as a function of angle is desirable. A phosphor converted light source without a high collimation, such as an LED, shows a strong angular dependence of color point. This is due to the fact that the path length of the pump light in the phosphor typically depends on the angle of incidence while emission from phosphor typically shows a Lambertian distribution. The pump light, for instance blue LED light emitted by an LED 1, falls onto the ceramic or phosphor 2, respectively, as shown in FIG. 1. At larger angles the pump light shows a longer path length defined by the equation $d/\cos(\Theta)$, where d is the thickness of the phosphor 2 and $\Theta$ is the angle of incidence of the blue pump ray. This situation is depicted in FIG. 1.

Figure 2:
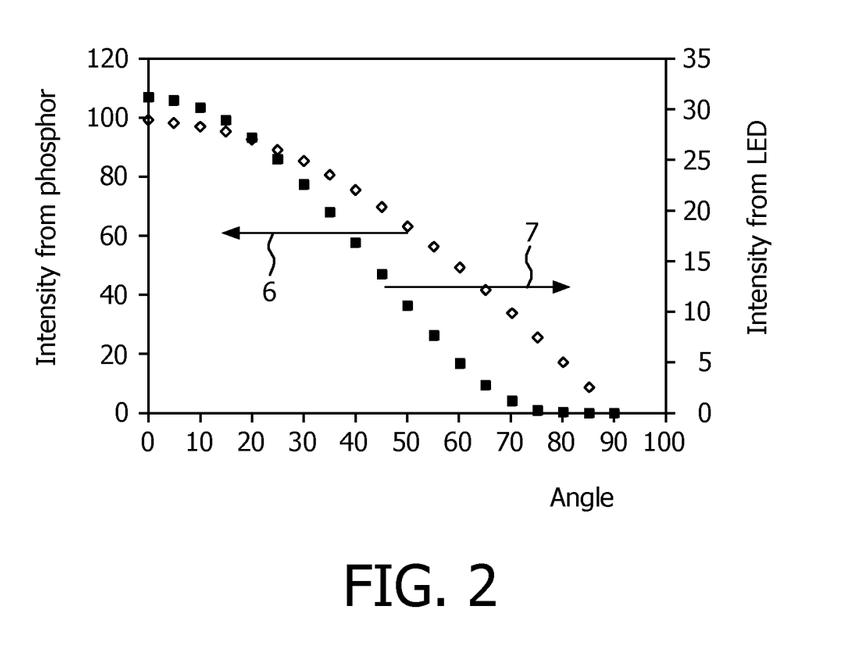
FIG. 2 shows blue and yellow light with different angular distributions referring to FIG. 1.

This effect results in blue and yellow light characterized by different angular distributions as shown in FIG. 2. In FIG. 2 it can be seen that emission of yellow light 6 from a phosphor 2 shows a Lambertian angular distribution whereas the initial Lambertian distribution of blue pump light 7 is altered such that the angular distribution becomes narrower after going through the phosphor 2.

Figure 3A:
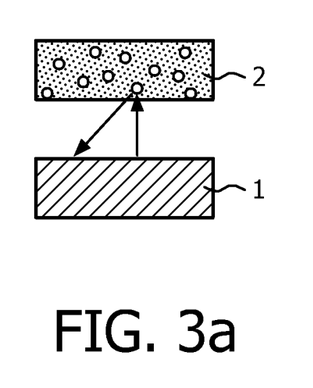
FIGS. 3a and 3b show two possibilities to obtain a constant color point distribution.
Figure 3B:
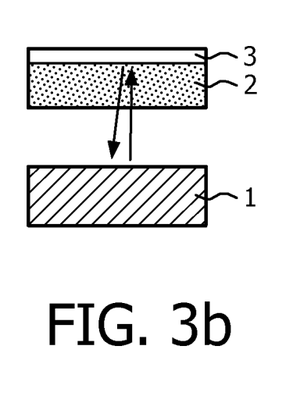

In order to decrease losses, different solutions have been proposed in the prior art. However, these suggestions lead to reduced system efficiency while providing a possibility to achieve an almost constant color point. For instance, such a phosphor 2 can be made highly scattering which leads to the fact that a large amount of light is back scattered and lost in the phosphor converted light source system which is pumped by an LED 1 as shown in FIG. 3a. Another solution is placing a blue reflector 3 on top of the phosphor 2. However, a disadvantage of this solution is losing light in the phosphor converted light source system as a result of back reflection of the blue reflector 3 as shown in FIG. 3b.

Furthermore, there are applications, such as automotive lighting, where more complicated angular light color distribution is needed for comfort and safety. This is very difficult to obtain in a simple way by using LEDs.

SUMMARY OF THE INVENTION

It is the object of the invention to provide a possibility to provide a versatile light emitter with a predefined angular color point distribution in conjunction with different desired angular light intensity distributions at low costs.

This object is achieved by the subject matter of the independent claims. Preferred embodiments are defined in the sub claims.

According to a first aspect of the invention, this object is achieved by a light emitter adapted for emitting light with a predefined angular color point distribution through an output, comprising a phosphor and a pump source, wherein the pump source is adapted for emitting pump light to at least part of the phosphor, and the phosphor is adapted for emitting phosphor light by light conversion of absorbed pump light, and wherein a matching element is provided which is arranged at least partly between the phosphor and the output of the light emitter, and which is adapted for adjusting the ratio of the light intensity of the emitted phosphor light emitted by the phosphor towards the output of the light emitter to the light intensity of the transmitted pump light going through the phosphor towards the output of the light emitter.

The term "a matching element is provided which is arranged at least partly between the phosphor and the output of the light emitter" means that the matching element is provided at least partly between the phosphor and the output, however, the matching element can be arranged at least partly on top of the phosphor, wherein "on top" means over and does not require contact of the matching element to the phosphor. Further, it is noted that the term "the transmitted pump light going through the phosphor towards the output of the light emitter" relates to a portion of pump light which is not absorbed by the phosphor but is transmitted through the phosphor. Often, the phosphor light is either not or at least to a lesser extent affected by the matching element such that the angular distribution of the light intensity of the phosphor light is nearly unchanged. Even in the case the angular distribution of the light intensity of the phosphor light is influenced by the matching element the design of the matching element may be adapted such that the angular distribution of the light intensity of the pump light being adapted by the matching element matches the changed angular distribution of the light intensity of the phosphor light in order to get a desired color point distribution.

According to a preferred embodiment of the invention, the matching element is adapted for adjusting the angular light intensity distribution of the transmitted pump light such that the angular light intensity distribution of the transmitted pump light at least partly matches the angular light intensity distribution of the emitted phosphor light. The term "at least partly matches" means that the angular light intensity distribution of transmitted pump light and of emitted phosphor light, respectively, at least match in a predefined area of the solid angle in which the light from the light emitter is emitted.

According to another preferred embodiment of the invention, the matching element is adapted for adjusting the angular light intensity distribution of the transmitted pump light such that an asymmetric angular color point distribution is achieved. Any asymmetric angular color point distribution is possible, however, the angular color point distribution preferably corresponds to a light distribution with different behavior in a first predetermined range than in a second predetermined range, for instance a light distribution with white color in an angular range between −40° and 40°, with yellow color in an angular range between −40° and −90° and with blue color in an angular range between 40° and 90° is preferred in automotive lamp applications. In such an application, light is white in the forward direction for good visibility, to the left more yellow to avoid the blinding of the driver and more blue to the right in order to see the road marks.

According to a preferred embodiment of the invention, the matching element comprises a contact to the phosphor and/or an air gap is arranged between the matching element and the phosphor.

According to a preferred embodiment of the invention, the matching element comprises a material corresponding to the material of the phosphor. In other words, the structure of the matching element is preferably produced in the phosphor.

According to a preferred embodiment of the invention, the phosphor comprises an opening which is adapted for guiding the transmitted pump light to the matching element at least partly without being converted by the phosphor. Preferably, the opening goes from a bottom side to a top side of the phosphor, i.e. in a direction towards the matching element and/or to the output of the light emitter. However, also an opening going from a side surface of the phosphor to a surface of the matching element is possible as long as light is directed to the matching element and/or to the output of the light emitter.

According to a preferred embodiment of the invention, the matching element corresponds to a refractive optical element and/or to a diffractive optical element. The matching element preferably comprises a holographic element and/or a photonic crystal. Holographic elements and/or photonic crystals, for example, can easily be designed in a way that the angular distribution of the light intensity of the pump light, e.g. laser light, is strongly influenced but the, for example, Lambertian angular distribution of the light intensity of the phosphor light is nearly unaffected.

According to a preferred embodiment of the invention, the matching element corresponding to a refractive optical element and/or to a diffractive optical element comprises a predefined shape. This is beneficial because in various lighting applications, such as automotive lighting a complicated light distribution is needed. For example, on the road the beam must have a particular shape. In comparison to using an aperture less light is blocked and preferably the full amount of light produced by the phosphor can be used. This might be especially advantageous in decorative lighting applications. In other words the predefined shape comprised in the matching element can be realized by the emission surface of the matching element having a shaped structure.

According to a preferred embodiment of the invention, the phosphor comprises a predefined light scattering, more preferably a low light scattering. The matching element preferably comprises a plurality of regions and/or the matching element is preferably mechanically moveable. Preferably, the matching element comprises electrically switchable optical characteristics.

According to a preferred embodiment of the invention, the matching element comprises a material which shows high photo stability, such as a sol-gel material and/or siloxanes.

According to a preferred embodiment of the invention, the light emitter further comprises an optical direction unit which is arranged at an output of the pump source and/or at an output of the light emitter, wherein the optical direction unit is adapted for directing light in a predetermined direction. It is noted that the term "directing light" means at least partly reflecting light towards a predefined direction and/or at least partly collimating and/or focusing light in a predefined direction. Preferably, the optical direction unit comprises a reflector adapted for reflecting light and/or a focusing unit adapted for focusing and/or collimating light.

According to a second aspect of the invention, above mentioned object is achieved by a method of use for a light emitter according to a preferred embodiment of the invention in video flash applications, such as for mobile phones and for cameras. The application can also be used in office lighting, home lighting, shop lighting, accent lighting, theater lighting, decorative lighting etc.

According to a third aspect of the invention, above mentioned object is achieved by a method of use for a light emitter according to a preferred embodiment of the invention in automobile headlight applications and/or in automotive lamp applications.

According to a fourth aspect of the invention, above mentioned object is achieved by a method for generating light with a predefined angular color point distribution, comprising the steps: a) pumping at least part of a phosphor to obtain phosphor light by light conversion of absorbed pump light; and b) adjusting the ratio of the light intensity of the emitted phosphor light emitted by the phosphor towards the output of a light emitter to the light intensity of the transmitted pump light going through the phosphor towards the output of the light emitter, thereby generating light with the predefined angular color point distribution.

According to a preferred embodiment of the invention, the method comprises the step of adjusting the angular light intensity distribution of the transmitted pump light such that the angular light intensity distribution of the transmitted pump light at least partly matches the angular light intensity distribution of the emitted phosphor light.

According to another preferred embodiment of the invention, the method comprises the step of adjusting the angular light intensity distribution of the transmitted pump light such that an asymmetric angular color point distribution is achieved.

According to a preferred embodiment of the invention, the method comprises the step of guiding the transmitted pump light to a matching element at least partly without being converted by the phosphor.

The phosphor preferably shows low light scattering. Preferably, a low light scattering phosphor comprises a predefined characteristic such that a light beam passing through the phosphor may show essentially a small angle light scattering, i.e. a scattering angle preferably less than 10 degrees. In case of a phosphor showing scattering to larger angles, the ratio of integral intensity of the direct portion of the beam, i.e. the unscattered portion of the beam, to the scattered portion of the beam is preferably more than one.

It is an idea of the invention to provide a light emitter or light source, respectively, preferably a high intensity light source, with "tailor-made" multidimensional color point distribution. In automotive lighting applications, a complicated light distribution can be desired for comfort and safety. The invention preferably provides a versatile light source which preferably uses a collimated high intensity light source, such as a laser going preferably through a phosphor, where part of e.g. blue light is preferably converted and/or the transmitted laser beam preferably goes through a refractive and/or diffractive element which preferable creates a desired light distribution for the laser light. It is noted that the superimposition of light, which is preferably generated by partial conversion of the laser beam onto an altered light distribution of the laser beam, preferably gives any color point distribution that is desired. In this way, a perfect or nearly constant white color point as a function of angle can be obtained.

To sum up, the invention preferably provides a collimated point light source, such as a laser combined with preferably a transparent phosphor ceramic which preferably comprises a refractive and/or a diffractive element which preferably induces a Lambertian distribution of the laser light to an output of the light emitter. The term "induce" means that the angular light intensity distribution of each element, i.e. of the laser and the refractive and/or diffractive optical element, can be matched to obtain an almost perfect angular independent color point light source. Such a light emitter is preferred in video flash, such as in mobile phones and/or in cameras. Any desired color point pattern can be produced by preferably using a high intensity pump source, such as a laser, preferably in combination with a light conversion material, such as a phosphor. It is also possible to influence the collimation of the light coming out of the phosphor by adjusting the collimation of the light onto the phosphor. For this purpose it is necessary to use a transparent ceramic phosphor.

In another aspect of the invention, the object of the invention is also achieved by a light emitter adapted for emitting light with a predefined angular color point distribution through an output, comprising a phosphor and a pump source, wherein the pump source is adapted for emitting pumped light to at least part of the phosphor, and the phosphor is adapted for emitting phosphor light by light conversion of absorbed pump light, and wherein the phosphor can be shaped for projecting a resulting shaped light pattern through the output onto a surface. The shape of the phosphor can have any desired form or pattern like basic geometric forms, figurative patterns, letters and words, etc. Preferably, the shape of the phosphor is reflecting the desired shape of the light beam of an automobile headlight. Furthermore, the shaped phosphor may preferentially be placed in a reflecting matrix which is or may be part of the matching element. The bottom surface from which the phosphor is illuminated may be placed on top of a solid state lighting device. In case a laser is used for illuminating the phosphor at the bottom surface a reflector may be used. The reflector may selectively transmit laser wavelength and reflects light from the phosphor.

Alternatively or additionally, it is also possible to influence the collimation of the light coming out of the phosphor by adjusting the collimation of the light onto the phosphor. For this purpose it is necessary to use a transparent ceramic phosphor and a diverting element is placed between the laser and the phosphor for reshaping the initially parallel laser beam into a more divergent laser beam. With this, the flat top intensity pattern for the phosphor emission obtained without the use of a diverting element preferentially is reshaped to have a more Lambertian distribution.

When a certain intensity distribution, e.g. a hot spot distribution, needs to be created, for this purpose also the laser beam can be shaped to show the desired intensity distribution upon illumination of the phosphor. As a result a special intensity profile of the projected light can be achieved.

According to a preferred embodiment the phosphor is placed in a reflecting matrix so that only one shaped surface is open for light emission. The bottom surface from which the phosphor is illuminated may be directly placed on top of the pump light emitting device. In case where laser is used for illuminating the phosphor, at the bottom surface a reflector which selectively transmits laser wavelength and reflects light from the phosphor can be used. Alternatively or additionally, it is also possible to use a geometry where the phosphor is illuminated form a side surface.

Preferably, the luminescent phosphor material is a highly low light scattering ceramic phosphor. According to other preferred embodiments of the invention, luminescent materials are selected from garnets and nitrides, preferably doped with trivalent cerium or divalent europium, respectively. Embodiments of garnets comprise $A_3B_5O_{12}$ garnets, wherein A comprises yttrium and/or lutetium and wherein B comprises aluminum. Such garnets are preferably doped with cerium (Ce), with praseodymium (Pr) or a combination of cerium and praseodymium, in particular with Ce. B preferably comprises aluminum (Al). According to other preferred embodiments of the invention, B comprises gallium (Ga) and/or scandium (Sc) and/or indium (In), preferably up to about 20% of Al, more preferably up to about 10% of Al, i.e. the B ions preferably comprise 90 or even more mole % of Al and comprise 10 or even less mole % of one or more of Ga, Sc and In.

B preferably comprises up to about 10% gallium. Preferably, B and O are at least partly replaced by Si and N. The element A is preferably selected from the group comprising yttrium (Y), gadolinium (Gd), terbium (Tb) and lutetium (Lu). Further, Gd and/or Tb are preferably present up to an amount of about 20% of A. Preferably, the garnet luminescent material comprises $(Y_{1-x}Lu_x)_3B_5O_{12}$:Ce, wherein x is equal to or larger than 0 and equal to or smaller than 1. The term ":Ce", indicates that at least part of the metal ions (i.e. in the garnets: part of the "A" ions) in the luminescent material is preferably replaced by Ce. For instance, assuming $(Y_{1-x}Lu_x)_3Al_5O_{12}$:Ce, part of Y and/or Lu is replaced by Ce. This notation is known to the person skilled in the art. Ce will replace A in general for not more than 10%; in general, the Ce concentration will be in the range between 0.1% to 4%, especially between 0.1% to 2% (relative to A). Assuming 1% Ce and 10% Y, the full correct formula is $(Y_{0.1}Lu_{0.89}Ce_{0.01})_3Al_5O_{12}$. Ce in garnets is preferably in the trivalent state, as known to the person skilled in the art.

The red luminescent material preferably comprises a material selected from the group comprising (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is preferably divalent, and replaces one or more of the indicated divalent cations. In general, Eu will not be present in amounts larger than 10% of the cation, preferably in the range between about 0.5 to 10, more preferably in the range between about 0.5 to 5% relative to the cation(s) it replaces. The term ":Eu", indicates that part of the metal ions is replaced by Eu (such as by $Eu^{2+}$). For instance, assuming 2% Eu in CaAlSiN$_3$:Eu, the correct formula is $(Ca_{0.98}Eu_{0.02})AlSiN_3$. Divalent europium preferably replaces divalent cations, such as the above divalent alkaline earth cations, preferably Ca, Sr or Ba.

The material (Ba,Sr,Ca)S:Eu can also be indicated as MS:Eu, wherein M comprises an element selected from the group comprising barium (Ba), strontium (Sr) and calcium (Ca). Preferably, M comprises in this compound calcium or strontium, or calcium and strontium, more preferably calcium. Here, Eu is introduced and preferably replaces at least a part of M (i.e. at least one of Ba, Sr, and Ca). Further, the material (Ba,Sr,Ca)$_2$Si$_5$N$_8$:Eu can also be indicated as M$_2$Si$_5$N$_8$:Eu, wherein M comprises an element selected from the group comprising barium (Ba), strontium (Sr) and calcium (Ca). Preferably, M comprises in this compound Sr and/or Ba. According to another preferred embodiment, M comprises Sr and/or Ba (neglecting the presence of Eu), more preferably 50% to 100%, more preferably 50 to 90% Ba and 50% to 0%, most preferably 50% to 10% Sr, such as Ba$_{1.5}$Sr$_{0.5}$Si$_5$N$_8$:Eu (i.e. 75% Ba; 25% Sr). Here, Eu is introduced and preferably replaces at least a part of M i.e. at least one of Ba, Sr, and Ca.

Likewise, the material (Ba,Sr,Ca)AlSiN$_3$:Eu is indicated as MAlSiN$_3$:Eu, wherein M comprises an element selected from the group comprising barium (Ba), strontium (Sr) and calcium (Ca). M preferably comprises in this compound calcium or strontium, or calcium and strontium, more preferably calcium. Here, Eu is introduced and preferably replaces at least a part of M (i.e. at least one of Ba, Sr, and Ca). BaMgA110O17:Eu2+ (BAM) comprises a suitable material which emits in the blue.

Inorganic phosphors with a cubic crystal structure are most preferred due to their high transparency even in a polycrystalline state. Preferably, also highly transparent polymers are used, such as poly methyl methacrylate doped with organic luminescent small molecules such as difluoro-boraindacene family (BODIPY), fluorescein dyes, fluerene derivatives, coumarin dyes, xanthene dyes, pyrromethene-BF2 (P-BF2) complexes, stillbene derivatives, rodamine dyes, perylene dyes and luminescent organic metal complexes such as Lanthanide(III) b-diketonate complexes. It is possible to use luminescent polymers such as polyphenylenevinylenes (PPV)'s derivatives, polyphenyls, and poly fluerenes and their copolymers and mixtures.

It shall be understood that a preferred embodiment of the invention can also be any combination of the dependent claims with the respective independent claim.

BRIEF DESCRIPTION OF THE DRAWINGS

These and other aspects of the invention will be apparent from and elucidated with reference to the embodiments described hereinafter. It is to be understood, however, that the drawings are designed solely for the purposes of illustration and not as a definition of the limits of the invention.

In the drawings.

DETAILED DESCRIPTION OF EMBODIMENTS

Figure 4:
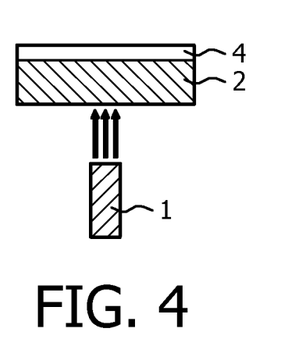
FIG. 4 shows a light emitter with angular color point distribution according to a first preferred embodiment of the invention.

FIG. 4 shows a light emitter with a predefined angular color point distribution according to a first preferred embodiment of the invention. A pump source 1, here a high intensity pump light source, such as a laser, is used. A highly collimated pump beam, such as laser light, goes through the phosphor 2 showing low light scattering so that the angular light intensity distribution of at least part of the laser light is not altered. Hence, the pump laser is combined with a ceramic phosphor 2. The pump source 1 is adapted for emitting optical radiation to at least part of the phosphor 2. A refractive and/or a diffractive optical component as a matching element 4 is arranged at least partly on top of the phosphor 2. The matching element 4 is a holographic element according to the first preferred embodiment of the invention. The matching element 4 is placed above the phosphor 2 in order to obtain almost any desired light distribution from the laser light as schematically shown in FIG. 4.

Figure 5A:
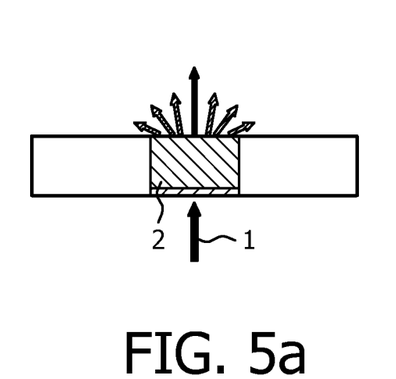
FIGS. 5a and 5b show a light emitter with angular color point distribution according to a second preferred embodiment of the invention.
Figure 5B:
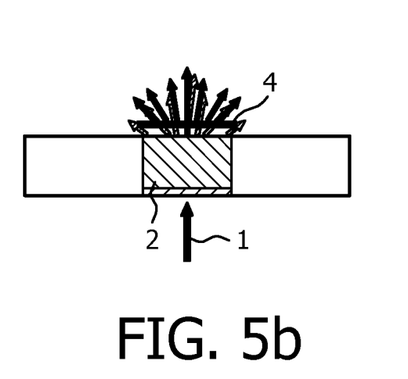

FIG. 5 shows a light emitter with angular color point distribution according to a second preferred embodiment of the invention. A matching element 4, such as a refractive and/or diffractive optical element, is designed such that the angular dependence of the intensity pattern of the laser through the matching element 4 at least partly matches the angular intensity distribution of the emission from the phosphor 2. FIG. 5a shows a pump source 1 that directly pumps a part of a phosphor 2. FIG. 5b shows the matching element 4 which is placed on top of the phosphor 2. According to the second preferred embodiment of the invention, an air gap is arranged between the matching element 4 and the phosphor 2 as illustrated in FIG. 5b. In this way, a white light source with an angular independent color point is provided which is desirable in certain applications, such as in camera flash and in general lighting applications.

Figure 6:
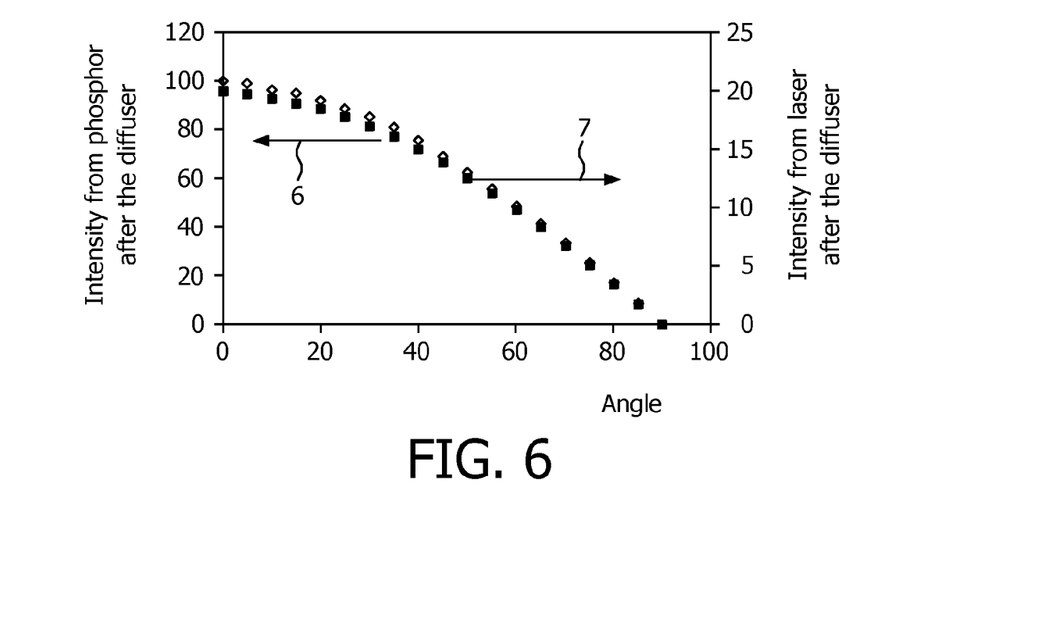
FIG. 6 shows the angular light intensity distribution for a constant color point of the light emitter according to the second preferred embodiment of the invention.

FIG. 6 shows almost identical angular light intensity distribution after the beam goes through the matching element which leads to a constant color point of the light emitter according to the second preferred embodiment of the invention. The intensity distributions coming from the phosphor and from the laser after going through the matching element are indicated in FIG. 6 with reference numerals 6 and 7, respectively.

Figure 7:
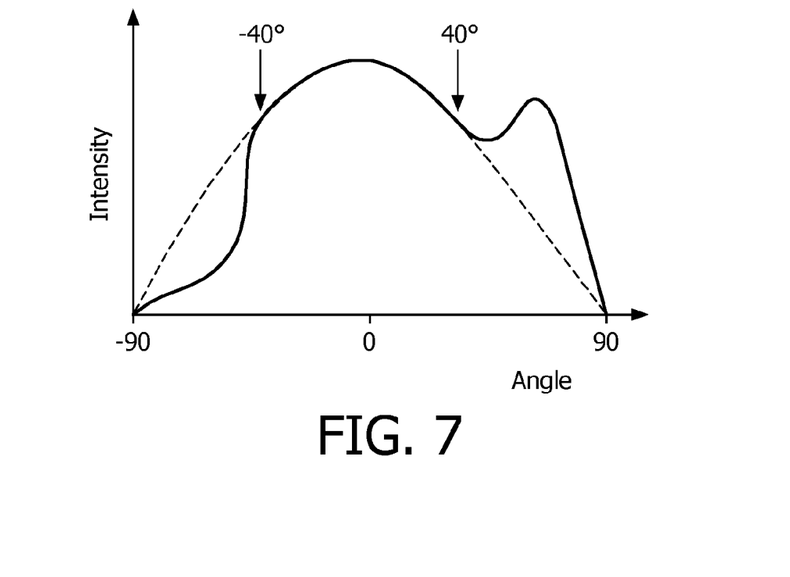
FIG. 7 schematically shows light distribution required for automative lighting applications according to a third preferred embodiment of the invention.

In automotive lighting applications, a more complicated angular light color distribution may be desired for comfort and safety. For instance, in the forward direction light is white for good visibility, to the left more yellow to avoid the blinding of the drivers and more blue to the right in order to see the road marks. Also here a light emitter as shown in FIG. 5b is used. Such a light emitter can be designed to give a light distribution pattern for the laser light to satisfy the above requirements. FIG. 7 shows a third preferred embodiment of the invention and schematically illustrates the light intensity distribution required from the laser to satisfy the condition described above. When light patterns from the laser and the phosphor are combined, white light is obtained in the angular range between −40° to 40° and more blue light to the right in the range between 40° to 90° and more yellow light in the range between −40° to −90°.

Figure 8:
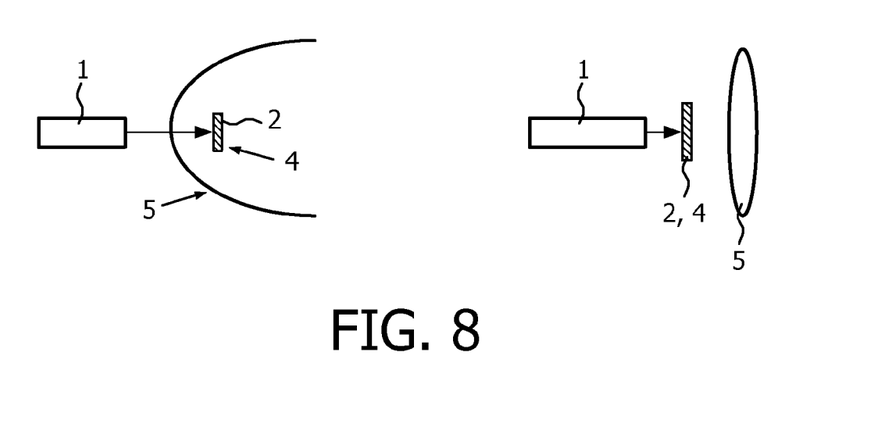
FIG. 8 shows a light emitter with angular color point distribution according to a fourth preferred embodiment of the invention.

The light emitter described above can be combined with other optical elements, such as with an optical direction unit comprising a reflector, a focusing unit, such as a lens, and/or a combination of such elements, which are adapted for imaging the patterns onto the desired surface, such as a floor and/or a road. FIG. 8 shows a light emitter with a predefined angular color point distribution according to a fourth preferred embodiment of the invention. FIG. 8 shows an optical direction unit 5 adapted for directing and/or for imaging light on a surface relative to floor. The optical direction unit 5 is arranged at an output of the pump source 1 as shown on the left part in FIG. 8. The optical direction unit 5 comprises a reflector, such as a mirror. As shown on the right part in FIG. 8, the optical direction unit 5 is arranged at an output of the light emitter, wherein the optical direction unit 5 comprises a focusing unit, such as a lens, according to the fourth preferred embodiment of the invention.

Figure 9:
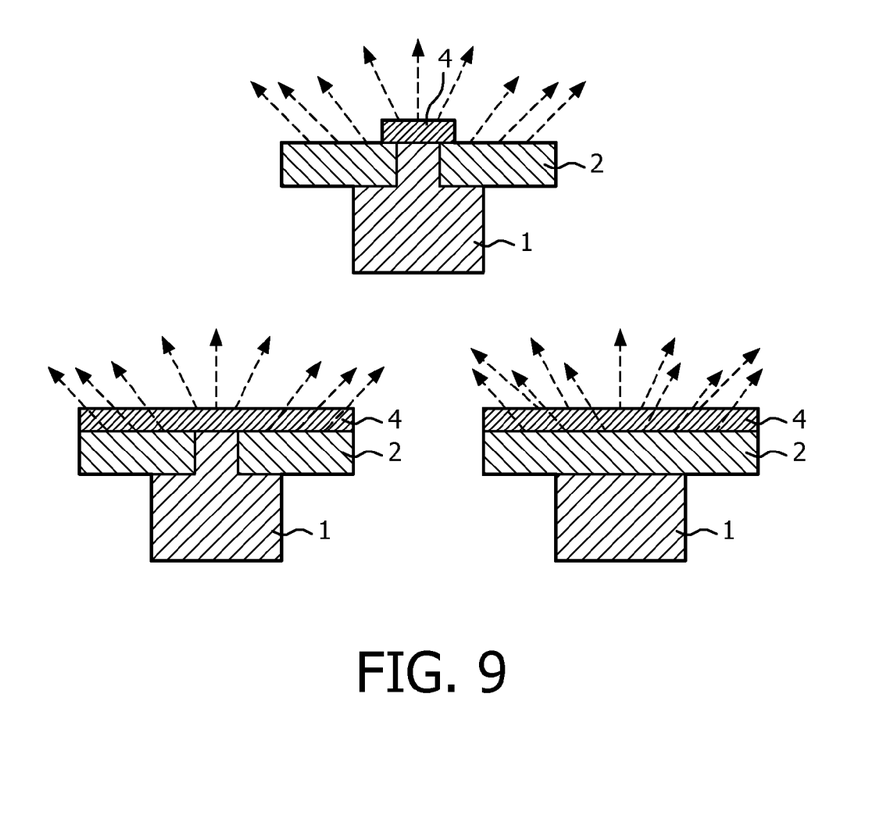
FIG. 9 shows a light emitter with angular color point distribution according to a fifth preferred embodiment of the invention.

The matching element described above can be covering the total surface or part of the surface of the phosphor 2. The laser beam and the diffractive and/or refractive optical elements can be combined in different ways. As shown in FIG. 9, which illustrates a fifth preferred embodiment of the invention, laser light might be partially converted by the phosphor 2. According to the fifth preferred embodiment of the invention the phosphor 2 comprises an opening, such as a "hole", which is adapted for guiding the optical radiation emitted by the pump source 1 directly to the matching element 4 at least partly without being converted by the phosphor 2. This situation is depicted in the upper and left part in FIG. 9. According to other preferred embodiments of the invention, the "hole" relates to an edge of the phosphor 2 or of a phosphor layer. According to the fifth preferred embodiment of the invention, only a part of the surface is covered by the diffractive and/or refractive optical element.

Figure 10:
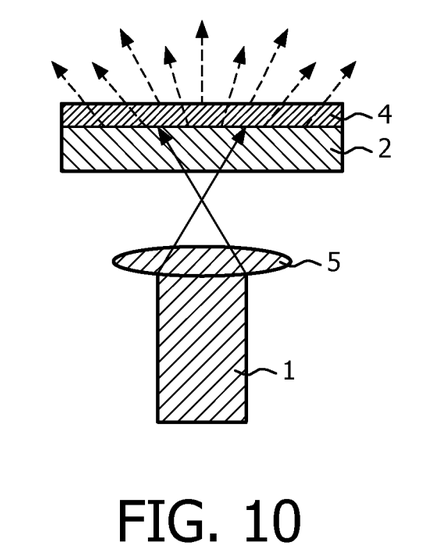
FIG. 10 shows a light emitter with angular color point distribution according to a sixth preferred embodiment of the invention.

FIG. 10 shows a sixth preferred embodiment of the invention, wherein the whole surface of the phosphor 2 is covered by the matching element 4. The diffractive and/or refractive optical element, which is comprised by the matching element 4, is patterned on top of the phosphor according to other preferred embodiments of the invention. FIG. 10 shows that it is possible to use extra elements, such as a focusing unit 5. The focusing unit 5 corresponds to a lens according to the sixth preferred embodiment of the invention and is placed directly at an output of the pump source 1.

Figure 11:
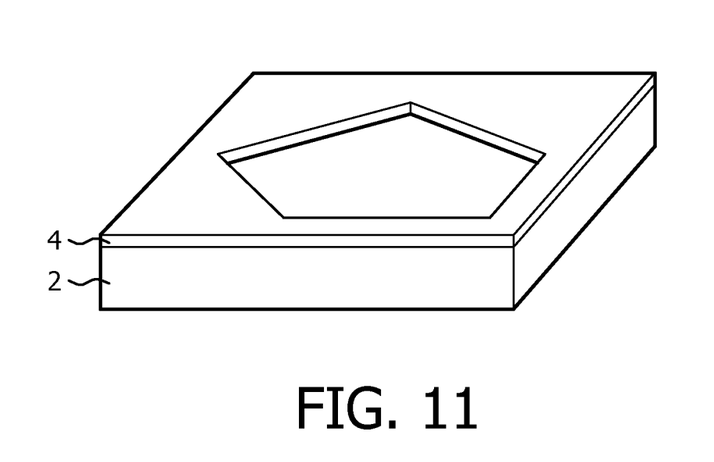
FIG. 11 shows a light emitter with angular color point distribution according to a seventh preferred embodiment of the invention.

FIG. 11 shows a light emitter with angular color point distribution according to a seventh preferred embodiment of the invention. A matching element 4 in an arrangement such as shown in FIG. 4, such as a refractive and/or diffractive optical element, is designed such that the matching element 4 comprises a predefined shape. As an example, the matching element 4 can have an emission surface comprising a predefined shaped structure. The structure can have a geometrical shape, for instance like a pentangle shown in FIG. 11. However, the matching element 4 also can have a complex shape as required in automotive lighting, for example. In addition, the phosphor 2 can be shaped as well in this configuration. In addition, multiple matching elements can be stacked onto each other.

According to another embodiment of the invention, the matching element comprises a plurality of regions. By mechanical movement of the matching element, preferably each time a different portion of the matching element is brought into the transmitted pump light. In this way, the color point distribution from the light source can be controlled.

According to yet another preferred embodiment of the invention, a matching element with electrically adjustable optical properties is used, such as a liquid crystal, suspended particles, electro-wetting, electrophoresis based devices. In this way, the color point distribution from the light source can be electrically controlled.

In above drawings and embodiments, use of a single laser beam in combination with a phosphor has been illustrated. However, it is also possible to use a plurality of pump beams, such as laser pump beams, with different emission characteristics, such as color and beam shapes, in order to obtain the desired color distribution effects.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitter adapted for emitting light with a predefined angular color point distribution through an output, comprising:
a phosphor layer,
a pump source for emitting pump light to at least part of the phosphor layer, the phosphor layer, being configured for emitting phosphor light by light conversion of a first portion of the pump light, wherein said first portion of the pump light is absorbed by the phosphor layer; and
a matching element arranged at least partly between the phosphor layer and the output of the light emitter, and configured for adjusting the ratio of the light intensity of the emitted phosphor light emitted by the phosphor layer towards the output of the light emitter to the light intensity of the transmitted pump light, wherein said second portion of the pump light is unconverted and is transmitted through the phosphor layer towards the output of the light emitter, wherein the matching element is further configured to modify an angular light intensity distribution of said second portion of the pump light by biasing the second portion of the pump light toward at least one direction over at least on other direction at said output such that an angular light intensity distribution of said emitted phosphor light is primarily unchanged by the matching element.

2. The light emitter according to claim 1, wherein the matching element is further configured for adjusting the angular light intensity distribution of the second portion of the pump light such that the angular light intensity distribution of the second portion of the pump light at least partly matches the angular light intensity distribution of the emitted phosphor light.

3. The light emitter according to claim 1, wherein the matching element is further configured for adjusting the angular light intensity distribution of the second portion of the pump light such that an asymmetric angular color point distribution is achieved.

4. The light emitter according to claim 1, wherein the phosphor layer defines an opening for guiding the second portion of the pump light to the matching element at least partly without being converted by the phosphor layer.

5. The light emitter according to claim 1, wherein the matching element corresponds to at least one of a refractive optical element and/or to a diffractive optical element.

6. The light emitter according to claim 5, wherein the matching element comprises a predefined shape.

7. The light emitter according to claim 1, wherein the phosphor layer has predefined low light scattering properties.

8. The light emitter according to claim 1, wherein the matching element comprises a plurality of regions and/or the matching element is mechanically moveable.

9. The light emitter according to claim 1, further comprising an optical direction unit which is arranged at an output of the pump source and/or at an output of the light emitter, wherein the optical direction unit is adapted for directing light in a predetermined direction.

10. A method for generating light with a predefined angular color point distribution, comprising the steps:

a) pumping at least part of a phosphor with a first portion of pump light to obtain phosphor light by light conversion of the first portion of the pump light, which is absorbed by the phosphor; and b) adjusting the ratio of the light intensity of the phosphor light emitted by the phosphor towards an output of a light emitter to the light intensity of a second portion of the pump light, wherein the second portion of the pump light is unconverted and is transmitted through the phosphor towards the output of the light emitter, thereby generating light with the predefined angular color point distribution, wherein the adjusting further comprises modifying an angular light intensity distribution of said second portion of the pump light by biasing the second portion of the pump tight toward at least one direction over at least one other direction at said output such that an angular light intensity distribution of said emitted phosphor light is primarily unchanged.

11. The method according to claim 10, wherein the modifying the angular light intensity distribution of the second portion of the pump light is performed such that the angular light intensity distribution of the second portion of the pump light at least partly matches the angular light intensity distribution of the emitted phosphor light.

12. The method according to claim 10, wherein the modifying the angular light intensity distribution of the second portion of the pump light is performed such that an asymmetric angular color point distribution is achieved.

* * * * *